United States Patent
Nam et al.

(10) Patent No.: US 11,226,367 B2
(45) Date of Patent: Jan. 18, 2022

(54) SUBSTRATE TESTING CARTRIDGE AND METHOD FOR MANUFACTURING SAME

(71) Applicant: KOREA INSTITUTE OF INDUSTRIAL TECHNOLOGY, Cheonan-si (KR)

(72) Inventors: Kyung Tae Nam, Incheon (KR); Sang Moo Lee, Yongin-si (KR); Seung Joon Lee, Gunpo-si (KR); Kwang Hee Lee, Suwon-si (KR); Sung Won Choo, Suwon-si (KR)

(73) Assignee: KOREA INSTITUTE OF INDUSTRIAL TECHNOLOGY, Cheonan-Si Chungcheongnam-Do (KR)

( * ) Notice: Subject to any disclaimer, the term of this patent is extended or adjusted under 35 U.S.C. 154(b) by 0 days.

(21) Appl. No.: 16/652,174

(22) PCT Filed: Aug. 21, 2018

(86) PCT No.: PCT/KR2018/009595
§ 371 (c)(1),
(2) Date: Mar. 30, 2020

(87) PCT Pub. No.: WO2019/066256
PCT Pub. Date: Apr. 4, 2019

(65) Prior Publication Data
US 2020/0249272 A1    Aug. 6, 2020

(30) Foreign Application Priority Data
Sep. 28, 2017 (KR) .................. 10-2017-0126318

(51) Int. Cl.
*G01R 31/28* (2006.01)
*G01R 1/04* (2006.01)
(Continued)

(52) U.S. Cl.
CPC ....... *G01R 31/2887* (2013.01); *G01R 1/0416* (2013.01); *G01R 1/06794* (2013.01); *G01R 1/073* (2013.01); *G01R 31/2893* (2013.01)

(58) Field of Classification Search
CPC  G01R 31/28; G01R 31/2831; G01R 31/2865; G01R 31/2867; G01R 31/2886;
(Continued)

(56) References Cited

U.S. PATENT DOCUMENTS

2003/0201764 A1* 10/2003 Jafari ................. G01R 31/2886
324/750.23
2009/0212803 A1*  8/2009 Yamamoto ......... G01R 31/2893
324/762.06
(Continued)

FOREIGN PATENT DOCUMENTS

JP    2009526992 A    7/2009
JP    2012018043 A    1/2012
(Continued)

OTHER PUBLICATIONS

International Search Report dated Nov. 19, 2018 for PCT/KR2018/009595.

*Primary Examiner* — Neel D Shah
(74) *Attorney, Agent, or Firm* — Cantor Colburn LLP

(57) ABSTRACT

The present invention relates to a substrate testing cartridge provided for simultaneously testing multiple substrates for which a substrate treatment process has been finished, and a method for manufacturing same. According to an embodiment of the present invention, a substrate testing cartridge comprises: a chuck member on which a substrate is placed; a probe card which contacts and tests the substrate and is positioned to face the chuck member with reference to the substrate; and coupling members which couple the substrate, the chuck member, and the probe card, wherein each coupling member comprises: a substrate coupling part which
(Continued)

couples the substrate and the chuck member; and a chuck coupling part which couples the probe card and the chuck member.

12 Claims, 10 Drawing Sheets

(51) Int. Cl.
   *G01R 1/067*     (2006.01)
   *G01R 1/073*     (2006.01)
(58) Field of Classification Search
   CPC ............ G01R 31/2887; G01R 31/2889; G01R 31/2893; G01R 1/04; G01R 1/0491; G01R 1/067; G01R 1/073
   See application file for complete search history.

(56) References Cited

U.S. PATENT DOCUMENTS

| 2018/0252765 | A1* | 9/2018 | Nagashima | ........ G01R 31/2887 |
| 2019/0025370 | A1* | 1/2019 | Kobayashi | ......... G01R 31/2877 |

FOREIGN PATENT DOCUMENTS

| JP | 2015082587 | A | 4/2015 |
| JP | 2015106626 | A | 6/2015 |
| KR | 1020160022775 | A | 3/2016 |
| KR | 101708575 | B1 | 2/2017 |

\* cited by examiner

200 : 210, 230, 250

200 : 210, 230, 250

SUBSTRATE TESTING CARTRIDGE AND METHOD FOR MANUFACTURING SAME

TECHNICAL FIELD

The present invention relates to a substrate testing cartridge and a method of manufacturing the same, and more particularly, to a substrate testing cartridge configured to test a plurality of substrates, of which a substrate treatment process performed thereon is completed, at the same time and a method of manufacturing the same.

BACKGROUND ART

Generally, semiconductor devices such as integrated circuit elements may be formed by repetitively performing a series of semiconductor processes on a semiconductor wafer. For example, semiconductor circuit elements may be formed on a wafer by repetitively performing a deposition process of forming a thin film on the wafer, an etching process of forming patterns having electrical properties by etching the thin film, an ion implantation or diffusion process for implanting or diffusing impurities into the patterns, a cleaning and rinsing process for removing impurities from the wafer on which the patterns are formed, and the like.

Semiconductor devices are formed through a series of such processes, and subsequently, a testing process for testing the electrical properties of the semiconductor devices may be performed. The testing process may be performed by a probe station, which includes a probe card including a plurality of probes, and a tester connected to the probe card to provide an electrical signal.

FIG. 1 is a view illustrating a general substrate testing apparatus. Referring to FIG. 1, a general substrate testing apparatus 1 (hereinafter, referred to as a single probe apparatus) can test one substrate in one instance of testing. Here, the substrate may be a wafer of which a treatment process performed thereon is completed.

The single probe apparatus 1 places a substrate on a substrate chuck 2 to test the substrate. The substrate is transferred from a cassette 3 to a stage. Afterwards, the substrate is aligned by moving the stage 4 to allow the substrate to come into contact with a probe card. The probe card comes into contact with the substrate placed on the substrate chuck 2 and the substrate is tested using a tester device.

However, since the above-described single probe apparatus can test only one wafer at a time, a test takes a long time. Also, since the testing time is longer in consideration of an amount of production of substrates, there is a disadvantage in that a limitation is present in total production time.

Recently, a technique capable of overcoming the above problem and testing a plurality of substrates at the same time has been required.

DISCLOSURE

Technical Problem

The present invention is directed to providing a substrate testing cartridge which allows substrates to be provided to test a plurality of such substrates at the same time and a method of manufacturing the same.

The present invention is also directed to providing a substrate testing cartridge configured to stably support a substrate while testing and provided to test a plurality of such substrates at the same time and a method of manufacturing the same.

The present invention is not limited thereto, and unstated other aspects will be clearly understood by those skilled in the art from the following description.

Technical Solution

The present invention provides a substrate testing cartridge provided to test a plurality of substrates, of which a substrate treatment process performed thereon is completed.

According to one aspect of the present invention, the substrate testing cartridge includes a chuck member on which the substrate is disposed, a probe card configured to come into contact with the substrate and to test the substrate and located to face the chuck member with the substrate therebetween, and a coupling member configured to couple the substrate, the chuck member, and the probe card. Here, the coupling member includes a substrate coupling portion configured to couple the substrate to the chuck member and a chuck coupling portion configured to couple the probe card to the chuck member.

The substrate coupling portion may include a substrate grabber having one end fixedly coupled to the probe card and the other end detachably coupled to the substrate.

The substrate grabber may be coupled to the substrate through a vacuum adsorption method.

Substrate align marks used for aligning positions of the substrate and the probe card may be formed on the substrate and the probe card.

The chuck coupling portion may include a support grabber having one end coupled to the probe card and protruding toward the chuck member and a coupling grabber coupled to the support grabber and formed to extend toward a center of the probe card.

A coupling groove, into which the coupling grabber is inserted, may be formed in the chuck member.

Chuck align marks used for aligning positions of the chuck member and the probe card may be formed on the chuck member and the probe card.

The chuck member may include a chuck on which the substrate is disposed and a heating portion located in the chuck and configured to heat the substrate.

The substrate coupling portion and the chuck coupling portion may be coupled to the probe card, and the substrate coupling portion may be located further adjacent to a center of the probe card than the chuck coupling portion.

The present invention provides a method of manufacturing a substrate testing cartridge provided to test a plurality of substrates, of which a substrate treatment process performed thereon is completed, at the same time.

According to one aspect of the present invention, the method includes a substrate preparing operation in which the substrate, of which the substrate treatment process performed thereon is completed, is placed on a chuck member, a substrate coupling operation in which the substrate and the chuck member are moved such that the probe card and the substrate are coupled to each other while the probe card comes into contact with the substrate, and a chuck coupling operation in which the chuck member is moved and coupled to the probe card.

The substrate and the probe card may be coupled using a vacuum adsorption method.

The probe card and the chuck member may be coupled by a chuck coupling portion which includes a support grabber and a coupling grabber coupled to the support grabber and formed to extend toward a center of the probe card.

The coupling grabber may be inserted into a coupling groove formed in the chuck member The method may further include a substrate position adjusting operation, after the substrate preparing operation and before the substrate coupling operation, in which a position of the substrate is adjusted on the basis of a position of the probe card located above the chuck member.

The method may further include a chuck position adjusting operation, after the substrate coupling operation and before the chuck coupling operation, in which a position of the chuck member is adjusted on the basis of a position of the probe card coupled to the substrate.

Advantageous Effects

According to one embodiment of the present invention, efficiency in testing substrates may be improved by providing a substrate testing cartridge to test a plurality of substrates at the same time so as to test for a defect of a substrate of which a substrate treatment process performed thereon is completed.

Also, according to one embodiment of the present invention, a substrate testing cartridge may firmly couple a substrate, a chuck member, and a probe card through mechanical coupling of coupling members.

Also, according to one embodiment of the present invention, when a substrate testing cartridge is manufactured, time for manufacturing the substrate testing cartridge may be reduced by using a mechanical coupling method unlike a conventional vacuum coupling method.

Also, according to one embodiment of the present invention, since it is possible to test a plurality of substrates at the same time using a substrate testing cartridge, efficiency in a substrate testing process may be improved.

Effects of the present invention are not limited to the above-described effects and other unstated effects should be clearly understood by one of ordinary skill in the art from the specification and the attached drawings.

MODES OF THE INVENTION

Figure 1:
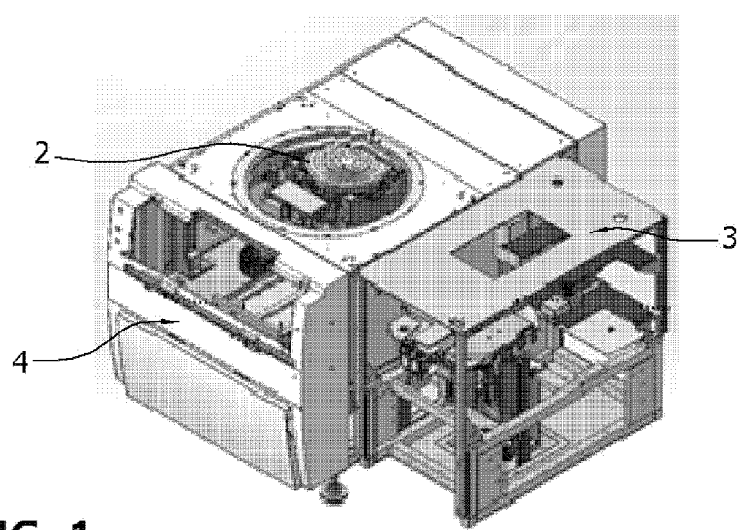
FIG. 1 is a view illustrating a general substrate testing apparatus.

Hereinafter, one embodiment of the present invention will be described in detail with reference to the attached drawings. The embodiments of the present invention may be modified in a variety of forms, and the scope of the present invention should not be construed as being limited to the following embodiments. The embodiments are provided to completely describe the present invention to one of ordinary skill in the art. Accordingly, throughout the drawings, shapes of elements may be exaggerated for more distinct description. Also, the terms used in the specification and the claims should not be limited to general or lexical meanings and should be interpreted as meanings and concepts coinciding with the technical concept of the present invention on the basis of a principle in which the inventor can appropriately define the concept of the terms to describe the invention in the best manner.

The present invention provides a substrate testing cartridge 200 to test a plurality of substrates 210, of which a substrate 210 treatment process performed thereon is completed, at the same time. As an example, the substrate testing cartridge 200 may be generated by a multi-probe system 10 capable of testing the plurality of substrates 210 at the same time. The substrate testing cartridge 200 generated by the multi-probe system 10 may be provided to a testing unit 500 and test the plurality of substrates 210 at the same time.

The substrates 210 according to the present invention are not limited to wafers and may include a variety of substrates 210 such as glass substrates 210 and the like. First, the above-described multi-probe system 10 will be described.

The multi-probe system 10 according to the present invention may test the plurality of substrates 210, of which the substrate 210 treatment process performed thereon is completed, at the same time. Here, the substrate 210 treatment process may mean wafers which have gone through a wafer manufacturing process using an ingot and a pretreatment process. Here, the pretreatment process includes an oxidization process, which oxidizes the substrate 210, a photo process, an etching process, and a cleaning process. Hereinafter, as an embodiment of the present invention, the substrate will be described with a wafer.

The multi-probe system 10 may be used in a testing process performed after the pretreatment process of the substrate 210 is finished.

Figure 2:
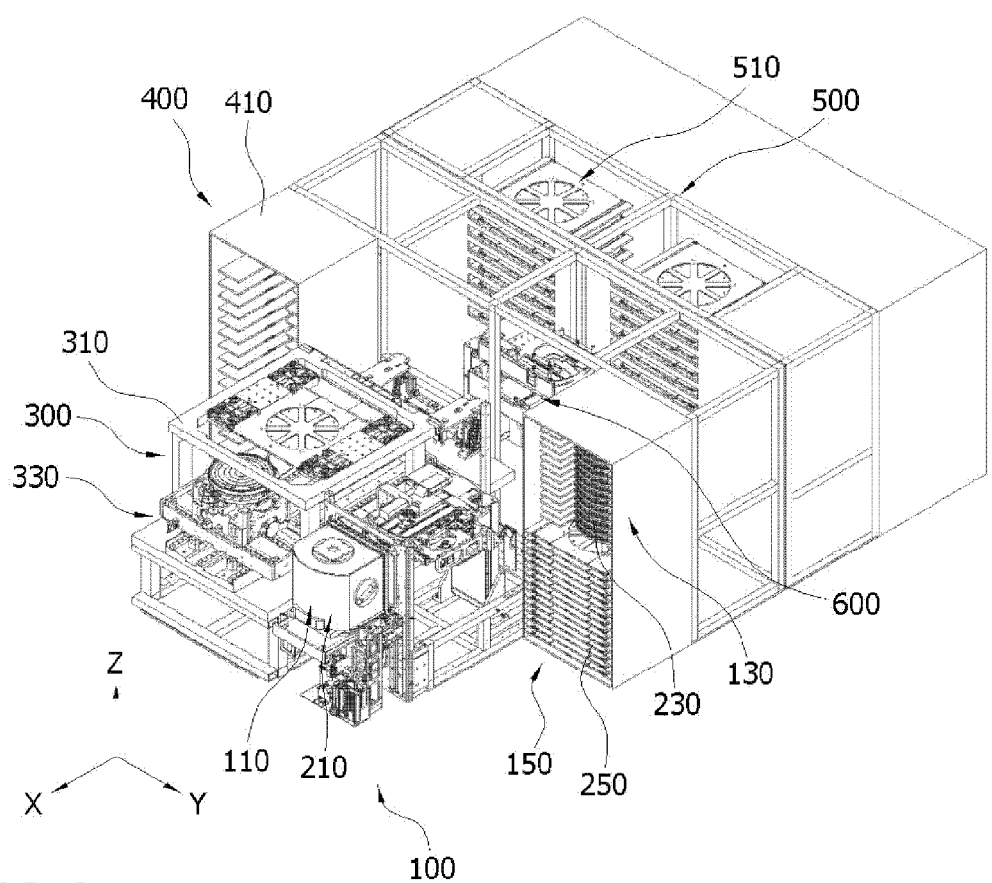
FIG. 2 is a perspective view illustrating a multi-probe system according to one embodiment of the present invention.
Figure 3:
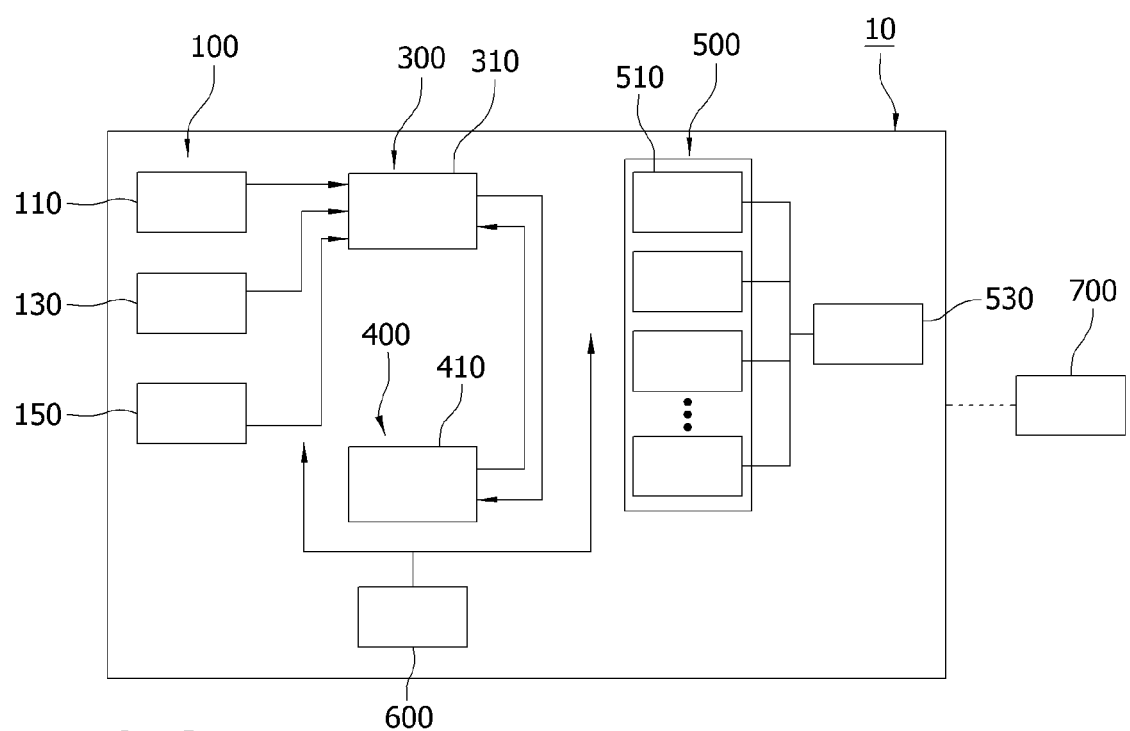
FIG. 3 is a view schematically illustrating an operation of the multi-probe system according to one embodiment of the present invention.

FIG. 2 is a perspective view illustrating a multi-probe system according to one embodiment of the present invention, and FIG. 3 is a view schematically illustrating an operation of the multi-probe system according to one embodiment of the present invention.

Referring to FIGS. 2 and 3, the multi-probe system 10 includes a supply unit 100, an aligner unit 300, a standby unit 400, the testing unit 500, a transfer unit 600, and a control unit 700.

The supply unit 100 may supply the substrate 210, a chuck member 230, and a probe card 250 to the aligner unit 300. The substrate 210, the chuck member 230, and the probe card 250 may be coupled to the substrate testing cartridge 200 by the aligner unit 300 which will be described below. The substrate testing cartridge 200 may include one substrate 210, the chuck member 230, and the probe card 250. The substrate testing cartridge 200 will be described below.

The supply unit 100 includes a substrate supply portion 110, a chuck supply portion 130, and a probe card supply portion 150.

The substrate supply portion 110 may accommodate the substrate 210 therein. The substrate 210 accommodated in the substrate supply portion 110 may be transferred to the aligner unit 300 by the transfer unit 600 which will be described below. The substrate supply portion 110 may be provided as a carrier accommodated in the substrate 210. As the carrier, a front opening unified pod (FOUP) may be used.

The substrate 210 accommodated in the substrate supply portion 110 may be the substrate 210 of which the substrate 210 treatment process performed thereon is completed.

The chuck supply portion 130 may accommodate a plurality of such chuck members 230 therein. The substrate 210 may be disposed on the chuck member 230. One substrate 210 may be placed on one chuck member 230.

The chuck member 230 accommodated in the chuck supply portion 130 may be transferred to the aligner unit 300 by the transfer unit 600 which will be described below.

The probe card supply portion 150 may accommodate a plurality of such probe cards 250 therein. As an example, the probe card 250 may come into contact with the substrate 210 and test to the substrate 210. As an example, a pin 251 capable of coming into contact with a pad P of the substrate 210 may be formed on the probe card 250.

The probe card 250 accommodated in the probe card supply portion 150 may be transferred to the aligner unit 300 by the transfer unit 600 which will be described below.

The probe card supply portion 150 may be located adjacent to the chuck supply portion 130. As an example, the probe card supply portion 150 may be located above the chuck supply portion 130. On the other hand, the probe card supply portion 150 may be located below the chuck supply portion 130.

Preferably, the probe card supply portion 150 may be located above the chuck supply portion 130. Since the chuck member 230, the substrate 210, and the probe card 250 are sequentially located while the substrate testing cartridge 200 is coupled, the probe card supply portion 150 may be located above the chuck supply portion 130 to optimize a transfer path of the transfer unit 600.

Figure 4:
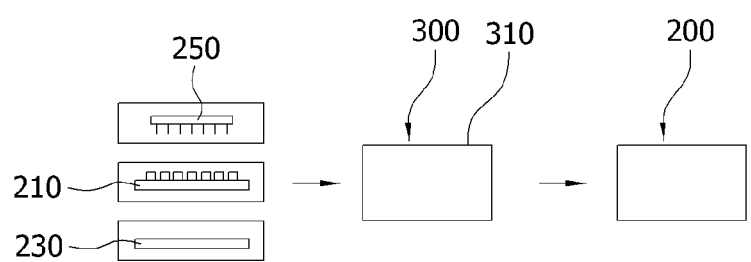
FIG. 4 is a view schematically illustrating a process of generating a substrate testing cartridge according to one embodiment of the present invention.

As shown in FIG. 4, the aligner unit 300 may couple the substrate 210, the chuck member 230, and the probe card 250, which are supplied from the supply unit 100, to the substrate testing cartridge 200.

The aligner unit 300 includes an aligner chamber 310 and an aligner device 330.

The aligner chamber 310 has a space therein. An internal space of the aligner chamber 310 may be a space in which the substrate 210, the chuck member 230, and the probe card 250 are aligned and coupled. The aligner chamber 310 may be located adjacent to the substrate supply portion 110.

The aligner device 330 may align and couple the substrate 210, the chuck member 230, and the probe card 250 to one substrate testing cartridge 200.

The aligner device 330 includes a probe card alignment portion (not shown), a position adjustment portion (not shown), a vision inspection portion (not shown), and an aligner control portion (not shown).

The probe card alignment portion may align the supplied probe cards 250. As an example, the probe card alignment portion may provide a space in which the probe card 250 is located. The probe card alignment portion may include a supporter which supports the probe cards 250. The probe card alignment portion may align the probe cards 250 at set positions.

The position adjustment portion may include a support on which the chuck member 230 is located. The support may have a stage capable of aligning X-axis, Y-axis, and Z-axis directions of the support therebelow. The position adjustment portion may adjust a position of the chuck member 230 placed on the support or the substrate 210 on the chuck member 230. As an example, the position adjustment portion may adjust a position of the substrate 210 according to an align mark (AM) of the probe card 250. On the other hand, the position adjustment portion may adjust a position of the chuck member 230 to couple the probe card 250 to the chuck member 230.

The position adjustment portion may generate the substrate testing cartridge 200 by coupling the probe card 250, the chuck member 230, and the substrate 210 after position alignment thereof. A process of generating the substrate testing cartridge 200 will be described below.

The vision inspection portion may take an image of a present position of the probe card 250, the chuck member 230, or the substrate 210 and calculate a precise position value for compensation. A position value and a compensation value provided by the vision inspection portion may be transmitted to the aligner control portion which will be described below.

The vision inspection portion may include a camera capable of taking an image of the probe card 250, the chuck member 230, or the substrate 210.

The aligner control portion may adjust a position of the probe card 250, a position of the chuck member 230, or a position of the substrate 210 by controlling the position adjustment portion or the probe card alignment portion using the position value or the compensation value transmitted from the vision inspection portion.

The substrate 210, a chuck 231, or the probe card 250 may stay temporarily in the standby unit 400 before moving into the testing cartridge 200. The testing cartridge 200 generated in the aligner unit 300 may stay temporarily in the standby unit 400 before being transferred to the testing unit 500.

The standby unit 400 includes a standby chamber 410.

The standby chamber 410 has a space therein. The substrate 210, the chuck 231, or the probe card 250 may move into and be accommodated in the standby chamber 410. The testing cartridge 200 formed in the aligner unit 300 may stay temporarily in the standby chamber 410 before being transferred 500. The testing cartridge 200 generated in the aligner unit 300 may be positioned temporarily in the standby chamber 410.

It is possible to reduce a time for coupling the testing cartridge 200 in the aligner unit 300 by coupling some of the testing cartridges 200 in advance in the standby unit 400. Also, when time is consumed for testing in the testing unit 500 or time is consumed for generating the substrate testing cartridge 200 in the aligner unit 300, since each component may be temporarily accommodated using the standby chamber 410, efficiency of the substrate 210 testing process may be improved.

The testing unit 500 may test the testing cartridge 200 generated in the aligner unit 300. The testing unit 500 includes a testing chamber 510 and a test portion 530.

The testing chamber 510 may have a space for testing the testing cartridge 200. A plurality of such testing chambers 510 may be provided. One testing cartridge 200 may be located in one testing chamber 510.

A channel connected to the test portion 530 which will be described below may be provided in the testing chamber 510. The channel may be provided as a backplane. The channel may be electrically connected to the test portion 530.

The test portion 530 may test several substrates 210 at once. When the testing cartridge 200 is located in the testing chamber 510 and connected to the channel, the test portion 530 connected thereto may test the substrate 210. The pin of the testing probe card 250 may remain in contact with the pad P of the substrate 210.

The test portion 530 may perform a burn-in test among several tests of the substrate 210. The burn-in testing may be performed in a state in which the substrate 210 is heated at a preset temperature using a chuck heating portion 233 which will be described below.

In the case of one embodiment of the present invention, since it is possible to test the plurality of substrates 210 at the same time in several testing chambers 510, a testing process time may be reduced. Particularly, an existing single probe device is capable of testing only one substrate 210 while testing. On the other hand, in the case of the embodiment of the present invention, since it is possible to simultaneously test as many of the substrates 210 as there are testing chambers 510, many substrates 210 may be tested at once in comparison to a conventional single probe device.

The transfer unit 600 may transfer the substrate 210, the chuck 231, the probe card 250, the testing cartridge 200 generated in the aligner unit 300, and the completely tested testing cartridge 200.

The transfer unit 600 may provide a transfer robot having a plurality of transfer arms. Here, the transfer robot may be a well-known robot used in a semiconductor testing process or manufacturing process. The transfer unit 600 may be provided as a plurality of such transfer robots.

The control unit 700 may be provided to control each component of the multi-probe system 10 to perform the testing process. As an example, the control unit 700 may control supply of the substrate supply portion 110, the chuck supply portion 130, and the probe card 250. As an example, the control unit 700 may control the transfer unit 600 to supply the substrate 210, the chuck 231, and the probe card 250 to the aligner unit 300 or the standby unit 400.

The control unit 700 may control the transfer unit 600 to transfer the testing cartridge 200 generated in the aligner unit 300 to the standby chamber 410 or the testing unit 500.

The control unit 700 may perform the testing process by controlling the testing unit 500 while the testing unit 500 tests the substrate 210.

The control unit 700 may control the transfer unit 600 to transfer the testing cartridge 200 having the substrate 210, which is determined by the testing unit 500 to be abnormal, to an additional space.

Figure 5:
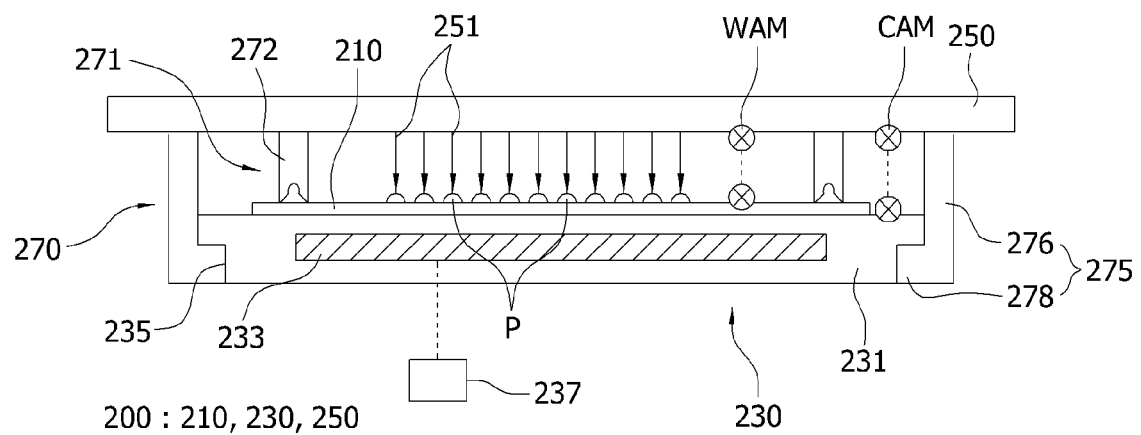
FIG. 5 is a view illustrating a substrate testing cartridge according to one embodiment of the present invention.

FIG. 5 is a view illustrating the substrate testing cartridge according to one embodiment of the present invention.

Referring to FIG. 5, the substrate testing cartridge 200 includes the substrate 210, the chuck member 230, and the probe card 250. As an example, the substrate 210, the chuck member 230, and the probe card 250 may be supplied to the aligner unit 300 as shown in FIG. 4. The aligner unit 300 may generate the substrate testing cartridge 200 by coupling the substrate 210, the chuck member 230, and the probe card 250. The substrate testing cartridge 200 is generated in the aligner unit 300 as an example in the embodiment of the present invention but is not limited thereto.

The substrate 210 may be the substrate 210 of which the substrate 210 treatment process performed thereon is completed. The substrate 210 may be placed on the chuck member 230 which will be described below. The substrate 210 may be located between the chuck member 230 and the probe card 250.

A wafer align mark (WAM) may be formed on the substrate 210. The WAM may be used for aligning positions of the substrate 210 and the probe card 250 while the substrate 210 and the probe card 250 are coupled. The WAM may be located in an edge area of the substrate 210.

As an example, when the substrate 210 and the probe card 250 are coupled, the position of the substrate 210 or the probe card 250 is aligned first such that the WAM formed on the substrate 210 faces the WAM formed on the probe card 250.

The chuck member 230 may support the substrate 210. The substrate 210 may be placed on a top surface of the chuck member 230.

The chuck member 230 includes the chuck 231, the chuck heating portion 233, and a control portion 237.

The chuck 231 may support the substrate 210. As an example, the substrate 210 may be placed on a top surface of the chuck 231. The top surface of the chuck 231 may be equal to or greater than that of the substrate 210. Preferably, the top surface of the chuck 231 may be provided to be greater than that of the substrate 210. As an example, when the substrate 210 is provided as a wafer, the top surface of the chuck 231 may be provided to have a circular shape.

The chuck 231 may be provided to be formed of a material having high heat conductivity. A coupling groove 235 may be formed below an outer peripheral surface of the chuck 231. The coupling groove 235 may be formed to be recessed toward a center of the chuck 231. A chuck coupling portion 275, which will be described below, may be coupled to the coupling groove 235. As an example, a part of a coupling grabber 278 is inserted into the coupling groove 235 so as to couple the chuck member 230 to the probe card 250. The coupling groove 235 is provided such that the chuck member 230 and the probe card 250 may be firmly coupled.

A chuck align mark (CAM) may be formed on the chuck 231. A plurality of such CAMs may be provided in an edge area of the top surface of the chuck 231. The CAMs may be formed outside a position at which the substrate 210 is placed. The CAM may be used for aligning positions of the chuck member 230 and the probe card 250 while the chuck member 230 and the probe card 250 are coupled. As an example, the CAM may be used for adjusting the position of the chuck member 230 or the probe card 250 such that the CAM of the chuck member 230 and the CAM of the probe card 250 face each other before the chuck member 230 and the probe card 250 are coupled.

The chuck heating portion 233 may heat the substrate 210. The chuck heating portion 233 may be located in the chuck 231. As an example, when it is necessary to heat the substrate 210, the chuck heating portion 233 may heat the top surface of the chuck 231 at a preset temperature in advance. When the top surface of the chuck 231 reaches the preset temperature, subsequently the substrate 210 may be located thereon.

As an example, the chuck heating portion 233 may be provided as a heater. On the other hand, the chuck heating portion 233 may be a well-known device capable of heating the chuck 231 but is not limited thereto.

The control portion 237 may control the chuck heating portion 233. As an example, when it is necessary to heat the substrate 210, the control portion 237 may operate the chuck heating portion 233 to increase a temperature of the top surface of the chuck 231 to the preset temperature. As an example, the control portion 237 may control the chuck heating portion 233 to heat the chuck 231 before the substrate 210 is placed.

The probe card 250 may come into contact with and be electrically connected to the substrate 210. As an example, the probe card 250 may have the probe card pin 251. A plurality of such probe card pins 251 may come into contact with the pad of the substrate 210 and be electrically connected to the substrate 210. The probe card 250 may be located above the substrate 210 and the chuck member 230.

As an example, when the substrate 210 is tested, the above-described testing unit 500 may be connected to the probe cards 250 of the plurality of substrate testing cartridges 200 and test the substrates 210.

The CAM may be formed on the probe card 250. The plurality of CAMs may be provided in an edge area of the probe card 250. The CAM may be formed further outward than the WAM. The CAM may be used for aligning positions of the chuck member 230 and the probe card 250 while the chuck member 230 and the probe card 250 are coupled. As an example, the CAM may be used for adjusting the position of the chuck member 230 or the probe card 250 such that the CAM of the chuck member 230 and the CAM of the probe card 250 face each other before the chuck member 230 and the probe card 250 are coupled.

The coupling member 270 may couple the substrate 210, the chuck member 230, and the probe card 250. The coupling member 270 includes a substrate coupling portion 271 and the chuck coupling portion 275.

The substrate coupling portion 271 may couple the substrate 210 to the probe card 250. As an example, the substrate coupling portion 271 may include a substrate grabber 272.

One end of the substrate grabber 272 may be fixed and coupled to the probe card 250. The other end of the substrate grabber 272 may be detachably coupled to the substrate 210. The substrate grabber 272 may extend in a direction from the probe card 250 toward the substrate 210. As an example, the substrate grabber 272 may couple the substrate 210 to the probe card 250 using a vacuum adsorption method. As an example, when the substrate grabber 272 comes into contact with the substrate 210, the substrate grabber 272 may be coupled to the substrate 210 by forming a vacuum thereinside using a decompression member. Through this, the substrate 210 and the probe card 250 may be coupled. A plurality of such substrate grabbers 272 may be provided. The chuck coupling portion 275 may couple the probe card 250 to the chuck member 230.

The chuck coupling portion 275 may be formed at the probe card 250. The chuck coupling portion 275 may be located outside the substrate grabber 272. A plurality of such chuck coupling portions 275 may be provided in an edge area of the substrate 210. The chuck coupling portion 275 may be located on a surface among surfaces of the probe card 250 which faces the substrate 210. The chuck coupling portion 275 may include an elastic material.

The chuck coupling portion 275 includes a support grabber 276 and the coupling grabber 278. The support grabber 276 may be coupled to the probe card 250. The support grabber 276 may be formed to protrude from one surface of the probe card 250.

The coupling grabber 278 may be formed to protrude from an end of the support grabber 276 in one direction. A protruding direction of the coupling grabber 278 may be formed inward. The coupling grabber 278 may be formed to protrude toward the substrate 210. The coupling grabber 278 may be coupled to the coupling groove 235 formed in one surface of the chuck 231. The coupling grabber 278 may be provided to have a shape corresponding to the coupling groove 235. The number of the coupling grabbers 278 may correspond to the number of the coupling grooves 235. The coupling grabber 278 may be coupled to the coupling groove 235 of the chuck 231 so as to strengthen coupling between the probe card 250 and the chuck 231.

The chuck coupling portion 275 may be provided to have an overall L shape due to coupling between the support grabber 276 and the coupling grabber 278.

Figure 6:
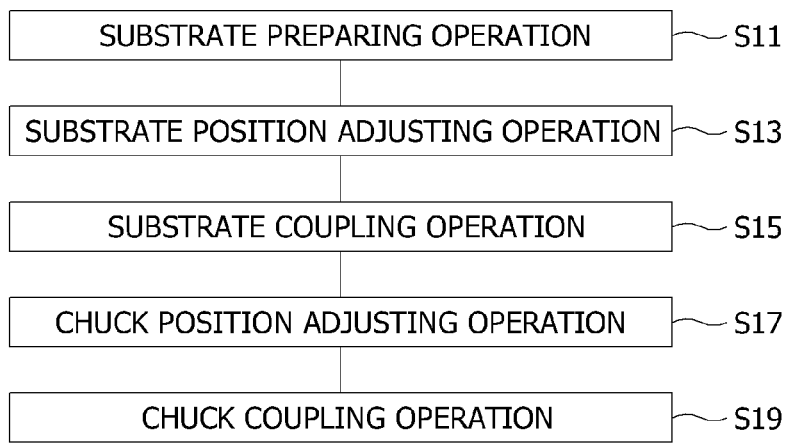
FIG. 6 is a flowchart illustrating a sequential process of a method of manufacturing a substrate testing cartridge according to one embodiment of the present invention.
Figure 7:
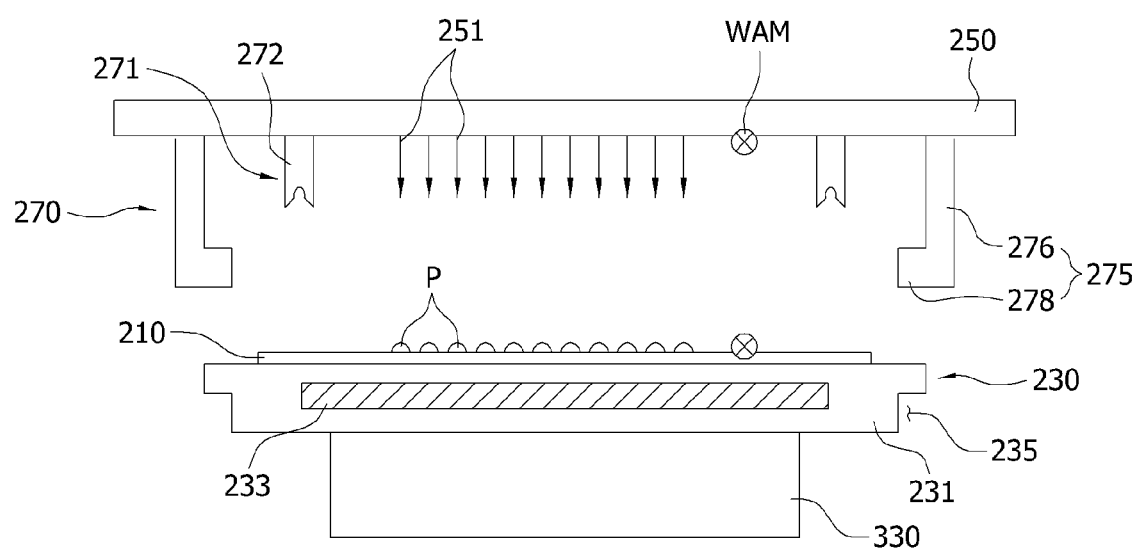
FIGS. 7 to 10 are views schematically illustrating the method of manufacturing the substrate testing cartridge according to one embodiment of the present invention.
Figure 8:
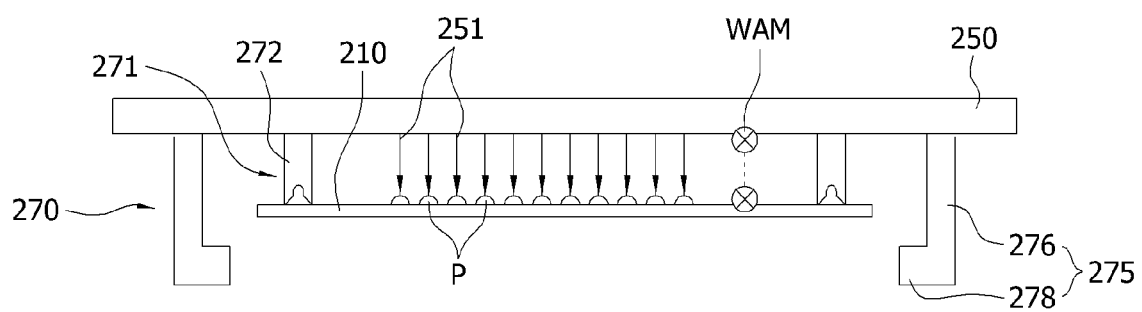
Figure 9:
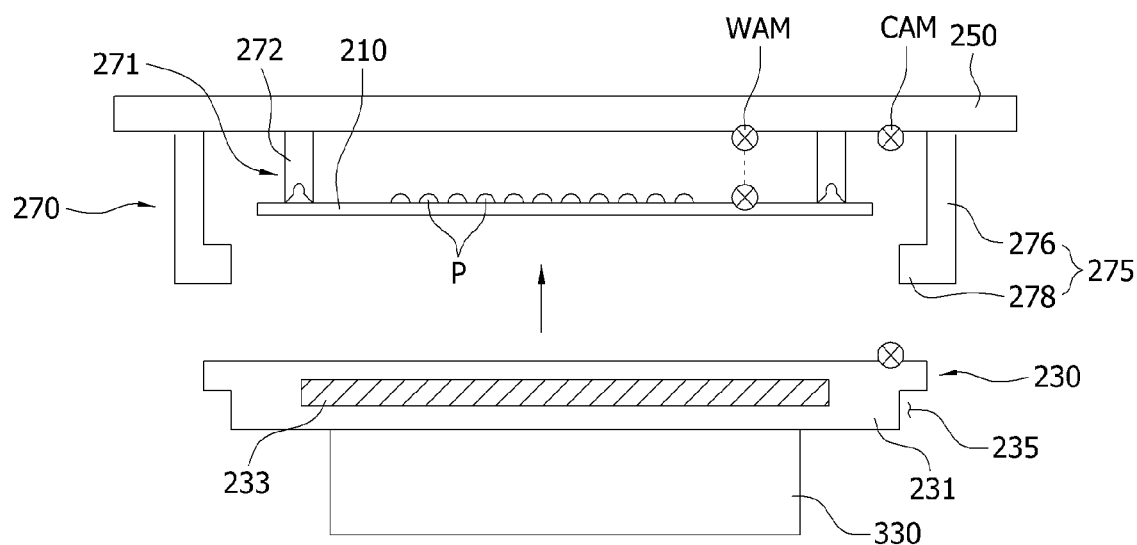
Figure 10:
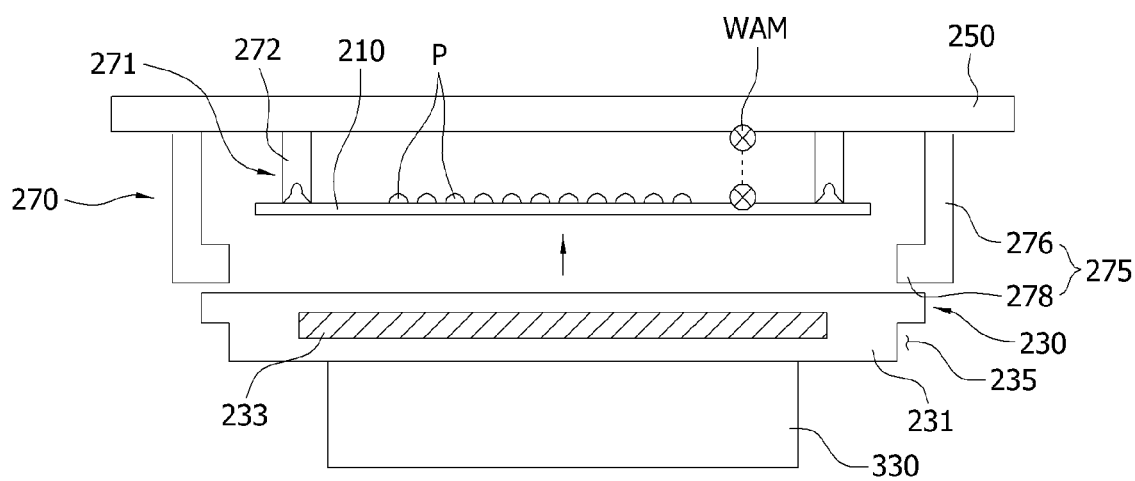

FIG. 6 is a flowchart illustrating a sequential process of a method of manufacturing a substrate testing cartridge according to one embodiment of the present invention. FIGS. 7 to 10 are views schematically illustrating the method of manufacturing the substrate testing cartridge according to one embodiment of the present invention.

A method of manufacturing the substrate testing cartridge 200 will be described with reference to FIGS. 5 to 10.

The method of manufacturing the substrate testing cartridge 200 includes a substrate preparing operation S11, a substrate position adjusting operation S13, a substrate coupling operation S15, a chuck position adjusting operation S17, and a chuck coupling operation S19.

The substrate preparing operation S11, the substrate position adjusting operation S13, the substrate coupling operation S15, the chuck position adjusting operation S17, and the chuck coupling operation S19 may be sequentially performed.

In the substrate preparing operation S11, components for coupling the substrate 210, the chuck member 230, and the probe card 250 are prepared. In the substrate preparing operation S11, the substrate 210 is placed on the chuck member 230.

In the substrate position adjusting operation S13, a position of the substrate 210 or the probe card 250 may be adjusted. As an example, the position of the substrate 210 or the probe card 250 may be adjusted such that WAMs formed on the probe card 250 and the substrate 210 face each other. As an example, the position may be adjusted by moving the substrate 210 on the basis of the position of the probe card 250. On the other hand, the position may be adjusted by moving the probe card 250.

In the substrate coupling operation S15, the substrate 210 is coupled to the probe card 250. As an example, in the substrate coupling operation S15, the substrate 210 is moved such that the pad P of the substrate 210 and the pin 251 of the probe card 250 may come into contact with each other. Afterwards, in the substrate coupling operation S15, the substrate 210 is coupled to the probe card 250 using the substrate coupling portion 271. As an example, the substrate coupling portion 271 may couple the substrate 210 to the probe card 250 using a vacuum adsorption method.

In the chuck position adjusting operation S17, positions of the probe card 250 coupled to the substrate 210 and the chuck member 230 are adjusted before coupling. In the chuck position adjusting operation S17, the position of the chuck member 230 may be adjusted on the basis of the position of the probe card 250 coupled to the substrate 210. As an example, the chuck member 230 may be moved such that CAMs formed on the chuck member 230 and the probe card 250 face each other. On the other hand, the probe card 250 may be moved such that the CAM of the chuck member 230 and the CAM of the probe card 250 are adjusted and face each other.

In the chuck coupling operation S19, the chuck member 230 is coupled to the probe card 250. After the positions of the chuck member 230 and the probe card 250 are completely adjusted, the chuck member 230 is moved upward and located adjacent to the probe card 250. Then, the chuck member 230 and the probe card 250 may be coupled by further moving the chuck member 230 such that the coupling grabber 278 of the chuck coupling portion 275 is inserted into the coupling groove 235 of the chuck 231.

The above-described method of manufacturing the substrate testing cartridge 200 may reduce a time for manufacturing the substrate testing cartridge 200 using a mechanical coupling method using the coupling member 270. Here, the substrate testing cartridge 200 may be manufactured within a unit of several seconds utilizing a mechanical method other than a conventional vacuum-coupling method.

Unlike the above example, in the substrate preparing operation S11, the chuck 231 may be heated at a preset temperature using the chuck heating portion 233 before the substrate 210 is placed.

As described above, according to one embodiment of the present invention, efficiency in testing substrates may be improved by providing a substrate testing cartridge to test a plurality of substrates simultaneously when testing a defect of a substrate of which a substrate treatment process performed thereon is completed.

Also, according to one embodiment of the present invention, a substrate testing cartridge may firmly couple a substrate, a chuck member, and a probe card through mechanical coupling of coupling members.

Also, according to one embodiment of the present invention, when a substrate testing cartridge is manufactured, time for manufacturing the substrate testing cartridge may be reduced by using a mechanical coupling method unlike a conventional vacuum coupling method.

Also, according to one embodiment of the present invention, since it is possible to test a plurality of substrates at the same time using a substrate testing cartridge, efficiency in a substrate testing process may be improved.

The above detailed description exemplifies the present invention. Also, the exemplary embodiments of the present invention have been described above, and the present invention may be applied in a variety of different combinations, changes, and environments. That is, changes or modifications may be made without departing from the scope of the concept of the present invention, the scope equivalent to the disclosed content, and/or the scope of skill or knowledge in the art. The above-described embodiments are merely used for describing an exemplary state for implementing the technical concept of the present invention, and a variety of changes required in detailed application fields and uses of the present invention may be made. Accordingly, there is no intention to limit the above detailed description of the present invention to the disclosed embodiments. Also, it should be construed that the attached claims include other embodiments.

The invention claimed is:

1. A substrate testing cartridge provided to test a plurality of substrates, of which a substrate treatment process performed thereon is completed, the substrate testing cartridge comprising:
a chuck member on which the substrate is disposed;
a probe card configured to come into contact with the substrate and to test the substrate and located to face the chuck member with the substrate therebetween; and
a coupling member configured to couple the substrate, the chuck member, and the probe card,
wherein the coupling member comprises:
a substrate coupling portion configured to couple the substrate to the probe card; and
a chuck coupling portion configured to couple the probe card to the chuck member,
wherein the substrate coupling portion includes a substrate grabber having one end fixedly coupled to the probe card and the other end detachably coupled to the substrate,
wherein the substrate grabber is coupled to the substrate through a vacuum adsorption method.

2. The substrate testing cartridge of claim 1, wherein substrate align marks used for aligning positions of the substrate and the probe card are formed on the substrate and the probe card.

3. The substrate testing cartridge of claim 1, wherein the chuck coupling portion comprises:
a support grabber having one end coupled to the probe card and protruding toward the chuck member; and
a coupling grabber coupled to the support grabber and formed to extend toward a center of the probe card.

4. The substrate testing cartridge of claim 3, wherein a coupling groove, into which the coupling grabber is inserted, is formed in the chuck member.

5. The substrate testing cartridge of claim 3, wherein chuck align marks used for aligning positions of the chuck member and the probe card are formed on the chuck member and the probe card.

6. The substrate testing cartridge of claim 1, wherein the chuck member comprises:
a chuck configured to place the substrate on the chuck; and
a heating portion located in the chuck and configured to heat the substrate.

7. The substrate testing cartridge of claim 1, wherein the substrate coupling portion and the chuck coupling portion are coupled to the probe card, and
wherein the substrate coupling portion is located to be further adjacent to a center of the probe card than the chuck coupling portion.

8. A method of manufacturing a substrate testing cartridge to test a plurality of substrates, of which a substrate treatment process performed thereon is completed, at the same time, the method comprising:
a substrate preparing operation in which the substrate, of which the substrate treatment process performed thereon is completed, is placed on a chuck member;
a substrate coupling operation in which the substrate and the chuck member are moved such that a probe card and the substrate are coupled to each other while the probe card comes into contact with the substrate; and
a chuck coupling operation in which the chuck member is moved and coupled to the probe card,
wherein the substrate and the probe card are coupled using a vacuum adsorption method.

9. The method of claim 8, wherein the probe card and the chuck member are coupled by a chuck coupling portion which comprises a support grabber and a coupling grabber coupled to the support grabber and formed to extend toward a center of the probe card.

10. The method of claim 9, wherein the coupling grabber is inserted into a coupling groove formed in the chuck member.

11. The method of claim 8, further comprising a substrate position adjusting operation, after the substrate preparing operation and before the substrate coupling operation, in which a position of the substrate is adjusted on the basis of a position of the probe card located above the chuck member.

12. The method of claim 11, further comprising a chuck position adjusting operation, after the substrate coupling operation and before the chuck coupling operation, in which a position of the chuck member is adjusted on the basis of a position of the probe card coupled to the substrate.

* * * * *